US006587340B2

(12) United States Patent
Grouell et al.

(10) Patent No.: US 6,587,340 B2
(45) Date of Patent: Jul. 1, 2003

(54) MAINTAINING COOLING EFFICIENCY DURING AIR MOVER FAILURE

(75) Inventors: William L. Grouell, San Ramon, CA (US); Fay Chong, Jr., Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/832,446

(22) Filed: Apr. 10, 2001

(65) Prior Publication Data

US 2002/0145853 A1 Oct. 10, 2002

(51) Int. Cl.[7] .................................................. H05K 7/20
(52) U.S. Cl. ........................ 361/695; 361/686; 361/687; 361/692; 454/184; 165/122
(58) Field of Search ................................ 361/687, 690, 361/692–699, 717–719, 725, 727; 454/184, 353, 346, 347, 359; 157/849; 415/177, 178, 213.1, 214.1; 165/122–126, 104.33; 137/512.1, 601, 607; 62/259.2; 236/49.3; 257/706–727; 174/15.1, 16.2, 16.3, 35 C; 364/708.1

(56) References Cited

U.S. PATENT DOCUMENTS

| | | | |
|---|---|---|---|
| 4,479,115 A | | 10/1984 | Holzhauer |
| 4,648,007 A | * | 3/1987 | Garner ........................ 361/384 |
| 5,210,680 A | | 5/1993 | Scheibler |
| 5,477,416 A | * | 12/1995 | Schkrohowsky et al. ... 361/695 |
| 5,483,102 A | | 1/1996 | Neal et al. |
| 5,493,474 A | * | 2/1996 | Schkrohowsky et al. ... 361/695 |
| 5,534,854 A | | 7/1996 | Bradbury et al. |
| 5,546,272 A | | 8/1996 | Moss et al. |
| 5,572,403 A | | 11/1996 | Mills |
| 5,787,971 A | | 8/1998 | Dodson |
| 5,790,430 A | | 8/1998 | Steiert |
| 5,793,610 A | * | 8/1998 | Schmitt et al. .............. 361/695 |
| 5,890,959 A | * | 4/1999 | Pettit et al. .................. 454/184 |
| 6,000,623 A | * | 12/1999 | Blatti et al. ................. 236/49.3 |
| 6,005,770 A | * | 12/1999 | Schmitt ....................... 361/695 |
| 6,011,689 A | * | 1/2000 | Wrycraft ..................... 361/695 |
| 6,031,717 A | * | 2/2000 | Baddour et al. ............. 361/687 |
| 6,115,250 A | * | 9/2000 | Schmitt ....................... 361/695 |
| 6,174,232 B1 | * | 1/2001 | Stoll et al. ................... 454/184 |
| 6,181,557 B1 | * | 1/2001 | Gatti ........................... 361/695 |

FOREIGN PATENT DOCUMENTS

| | | | | |
|---|---|---|---|---|
| EP | 0817554 A1 | * | 7/1998 | ............ H05K/7/20 |
| JP | 402128499 A | * | 5/1990 | ............ H05K/7/20 |

OTHER PUBLICATIONS

An article "Photocell Air Flow Vane Switch", Nov. 1978, US (IBM Technical Disclosure Bulletin, vol.21, Issue 6, p. 2192.*

* cited by examiner

Primary Examiner—Michael Datskovsky
(74) Attorney, Agent, or Firm—David W. Victor; Konrad, Raynes, Victor & Mann

(57) ABSTRACT

A method and apparatus may be employed for maintaining cooling efficiency during air mover failure. An electrical enclosure may include a heat-generating thermal load, multiple air movers configured to remove heat from the thermal load, and a backward-airflow reducing device configured to reduce the amount of air that can be drawn backwards through one of the air movers if that air mover fails. The backward-airflow reducing device may be a valve configured to open while the air mover if functioning and to close when the air mover is not functioning.

48 Claims, 9 Drawing Sheets

MAINTAINING COOLING EFFICIENCY DURING AIR MOVER FAILURE

BACKGROUND OF THE INVENTION

1. Field of the Invention

This invention relates to cooling electronic enclosures and, more particularly, to the use of air movers to cool electronic enclosures.

2. Description of the Related Art

Electronic enclosures may contain many different electronic devices that are designed to operate within certain temperature ranges. However, when operating, each electronic device may generate heat. If enough heat is generated within the enclosure to cause any of the enclosed electronic devices to operate outside of their operational temperature range, problems may occur. For example, in some cases, increased temperature may cause a system to malfunction or behave erroneously. Sometimes, increased heat may even damage the electronic devices or components within the enclosure.

In order to reduce heat-related problems, many electronic enclosures include cooling devices. One simple example of a cooling device is a passive heat sink that radiates heat from a device into the surrounding air. A passive heat sink is simply a piece of metal attached to a component in such a way that the component transfers heat to the heat sink. By increasing the surface area from which heat can be radiated, heat sinks increase the amount of heat that can be transferred from a component to the surrounding air. Some heat sinks have fins, which further increase the surface area and allow even more heat to be radiated away. In some systems, passive heat sinks may be all that is needed to ensure proper cooling. For example, convection will cause heated air to rise higher than cooler air, so in some cases, hotter air will naturally be circulated away from the heat-generating component while cooler air is constantly being circulated towards the component. In other systems though, factors such as the size of the enclosure or the orientation of the device within the enclosure may limit the beneficial effects of convection. In such situations, other cooling devices may be needed to prevent heat-related problems.

One problem with systems that simply radiate heat is that the heat may accumulate inside an area in the enclosure. For example, convection may no longer assist in cooling if all of the air in an area becomes equally heated. One situation where this might arise is if a heat-generating component is located near the top of an enclosure. The top component may quickly lose any benefits of convection due to the accumulation of heated air in the top of the enclosure. Another situation where this might arise occurs when many devices are mounted in close proximity in an enclosure. Each device's ability to radiate heat away from itself may be limited if the surrounding air has already been heated by the other components.

In order to alleviate problems that arise when heat accumulates, many systems incorporate devices that can move already-heated air away from an area and draw less-heated air into the area. Air movers such as fans and blowers (e.g., centrifugal fans) are popular cooling devices because they are capable of moving heated air away from and/or cooler air towards areas where heat-related problems may arise. By regularly moving heated air away from or cooler air over a component, the component's ability to radiate heat is better maintained. For example, air movers may move either warmer or cooler air to another section of an enclosure, move heated air from inside an enclosure to the outside of the enclosure, or move cooler air from outside an enclosure to the inside of the enclosure. In many enclosures, several air movers may be used to move the proper volume of air necessary to reduce heat-related problems to an acceptable level. Additional air movers may also be included to provide redundancy, so that if an air mover fails, one of the redundant air movers can be used as a replacement.

SUMMARY

Various embodiments of a method and apparatus for maintaining cooling efficiency during air mover failure are disclosed. In some embodiments, an electrical enclosure includes a heat-generating thermal load, multiple air movers configured to remove heat from the thermal load, and a backward-airflow reducing device configured to reduce the amount of air that can be drawn backwards through an air channel if an air mover fails. When functioning, each air mover is configured to draw air into an intake and to expel air from an exhaust so that the air within an air channel moves in a forward direction. The air movers remove heat from the thermal load by moving cooler air across the thermal load, allowing the thermal load to transfer heat to the air. In one embodiment, some of the air movers may be configured to blow air across the thermal load. In another embodiment, the air movers may instead draw air across the thermal load. The thermal load may, in some embodiments, comprise one or more disk drives.

The backward-airflow reducing device may be coupled to the exhaust side of the air mover in some embodiments. In other embodiments, the backward-airflow reducing device may instead be coupled to the intake side of the air mover. In still other embodiments, the backward-airflow reducing device may be coupled elsewhere within the enclosure. While the air mover is functioning, the backward-airflow reducing device may be configured to allow air to be drawn into the intake and expelled from the exhaust of the air mover.

In some embodiments, the backward-airflow reducing device may include a valve. In one embodiment, the valve may be configured to open in response to air being expelled from the exhaust when the air mover is functioning. In another embodiment, the valve may be configured to open in response to the air being drawn into the intake when the air mover is functioning. The electrical enclosure may, in one embodiment, include an electronic circuit configured to sense whether the air mover has failed and to generate a signal that causes the valve to close if the air mover has failed. In one embodiment, the valve may be configured to close in response to a drop or a reversal in air pressure that occurs when the air mover fails. In other embodiments, the valve may include a spring configured to open the valve if the air mover is functioning and/or to close the valve if the air mover is not functioning. In one embodiment, the valve may close due to gravity.

In other embodiments, a method for maintaining cooling efficiency in an electrical enclosure during air mover failure is disclosed. The method includes heating a portion of the electrical enclosure, operating multiple air movers within the enclosure to cool the heated portion of the enclosure by moving air across it, detecting whether one of the air movers has failed, and, if one of the air movers has failed, reducing the amount of air that can be drawn backwards through an air channel. In some embodiments, the enclosure may be heated by one or more disk drives. Operating the air movers may include blowing air or drawing air across the heated portion of the enclosure. A backward-airflow reducing device may reduce the amount of air that can be drawn backwards through an air channel. Detecting whether one of the air movers has failed may, in some embodiments, include passively sensing whether an air mover is functioning or not. For example, passively sensing may include responding to a drop or reversal in air pressure or responding to gravity or a combination of gravity and air pressure change or other means.

Thus, an air mover may be configured for use in an electrical enclosure. The air mover may include an intake configured to draw air into the air mover, an exhaust configured to expel air out of the air mover, and a backward-airflow reducing device configured to reduce the amount of air that can be drawn backwards through the air mover if the air mover fails.

Figure 1A:
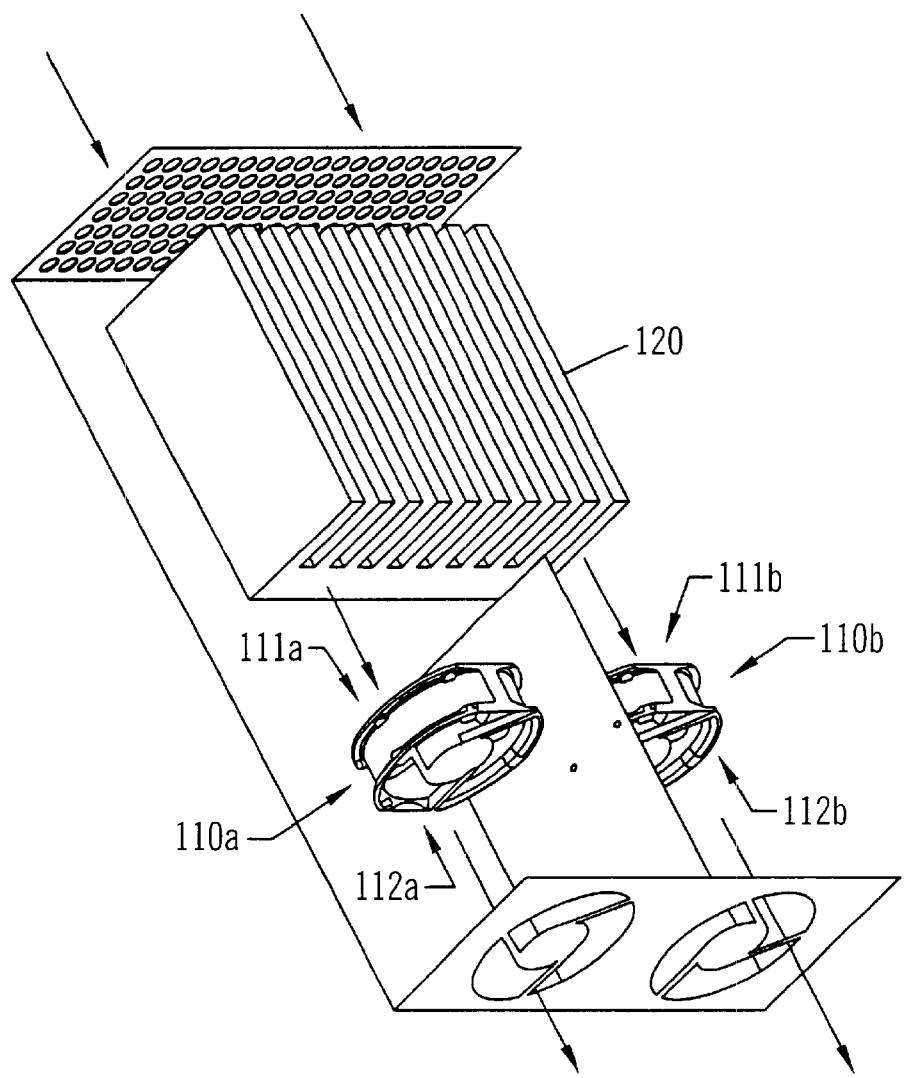
FIG. 1a shows a typical electrical enclosure containing two air movers that are configured to cool a thermal load.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

FIG. 1a shows an example of an enclosure containing several air movers 110 that are cooling a thermal load 120.

Figure 1B:
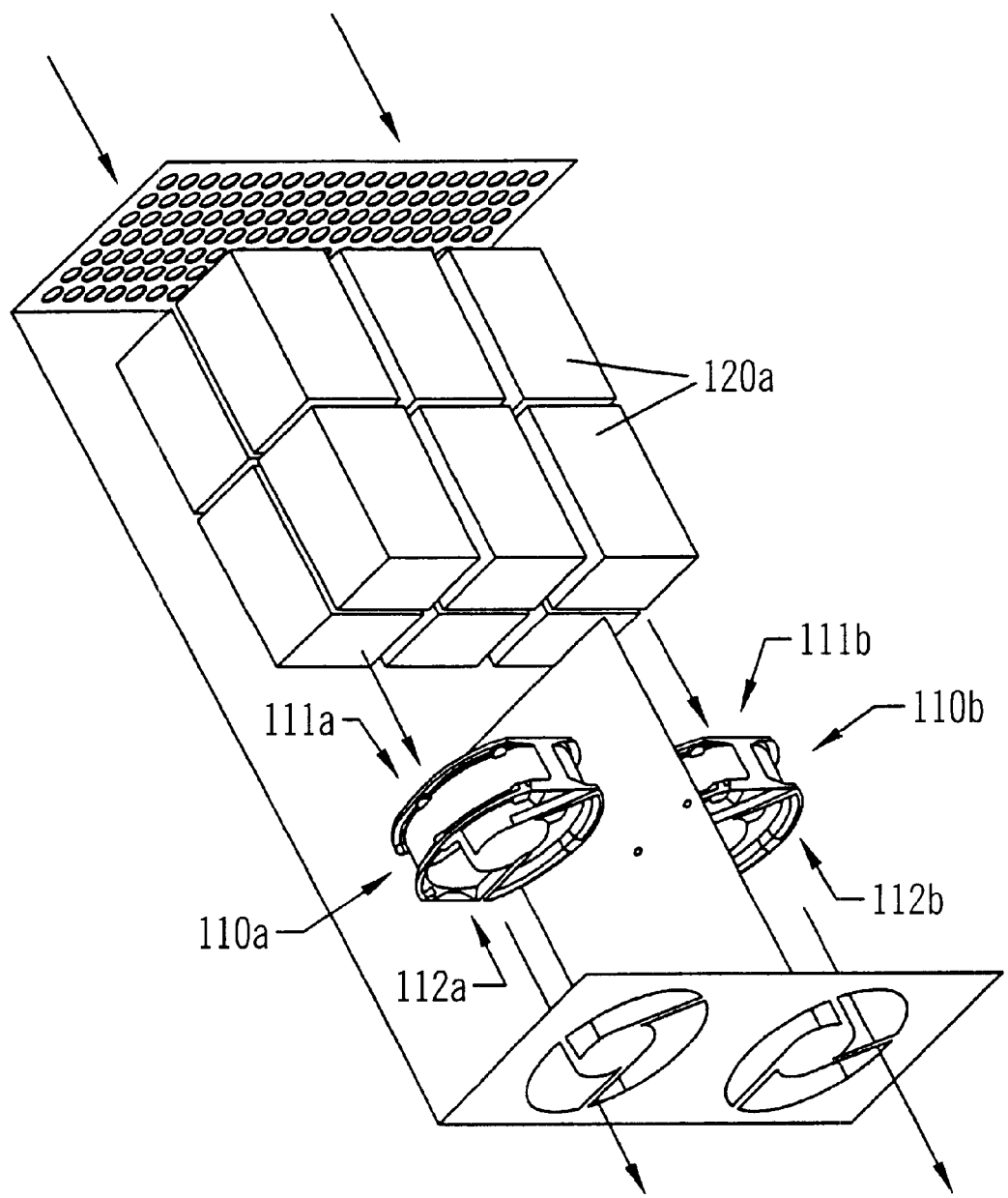
FIG. 1b shows another typical electrical enclosure containing two air movers that are configured to cool an arrangement of disk drives.

In FIG. 1a, the enclosure is shown without walls to better illustrate the air movement within the enclosure. The thermal load 120 may be any heat-generating component in an electrical enclosure. For example, in one embodiment, the thermal load 120 may be a disk drive. In another embodiment, the thermal load 120 may be an arrangement of disk drives, as is shown in FIG. 1b. The disk drives may, in one embodiment, be configured as a redundant array of independent disks (RAID) system. In other embodiments, the thermal load 120 may instead or additionally include other heat-generating components such as microprocessors.

Each air mover 110 has an intake 111 and an outtake or exhaust 112. The air movers 110 circulate air by drawing the air in at the intake 111 and expelling that air through the exhaust 112 so that the air within an air channel is moved in a forward direction (as indicated by the airflow arrows). In this embodiment, both of the air movers 110 are situated so that each pulls cooler air into the enclosure and across the thermal load 120. Heat from the thermal load 120 is transferred to the indrawn air as the air passes across the thermal load 120. The newly-heated air is then expelled from the enclosure. In some embodiments, either one of the air movers 110 may be capable of moving a sufficient volume of air to adequately remove heat from the thermal load 120. In those embodiments, the additional air mover may simply provide redundancy. In other embodiments, both air movers 110 may be necessary to move the volume of air needed to adequately remove heat from the thermal load 120.

While FIGS. 1a and 1b show the multiple air movers drawing air into the enclosure, pulling that indrawn air across the thermal load 120, and then expelling the heated air from the enclosure, other embodiments may use different cooling configurations. For example, in another embodiment, the air movers may instead be configured to draw air into the enclosure at their intakes and expel this cooler air from their exhausts so that it passes across the thermal load 120 and is then expelled from the enclosure. In other embodiments, the air movers may be moving air from cooler parts of the enclosure (instead of from outside the enclosure) and then drawing or blowing that cooler air across a thermal load. In some embodiments, such as those shown in FIGS. 1a and 1b, the air movers may be, for example, axial fans that create a straight-line airflow. In other embodiments, the air movers may generate different airflows. For example, some air movers may be configured so that the exhaust is perpendicular to the intake. Additionally, in some embodiments, the air movers may be configured with air filters to prevent dust and other small particles from being drawn or blown across the thermal load. Air filters may, in some embodiments, be placed near a vent in the enclosure instead of one the air movers. In one embodiment, the air movers may also be configured to move variable amounts of air depending on the temperature of the thermal load.

In enclosures containing multiple air movers such as the ones illustrated in FIGS. 1a and 1b, failure of an air mover may result in the other air mover(s) drawing air backwards through the failed air mover and/or an air channel associated with that air mover. An air channel may be a flow path or portion of the enclosure through which air is primarily moved by a particular air mover. Failure of a particular air mover may reduce the airflow over the electronic components that are being cooled. At the same time, the components may be cooled less if the reduced number of air mover(s) do not circulate as large a volume of air as was circulated before the failure. Additionally, by pulling air backwards through the failed unit's air channel, the remaining air mover(s) may be moving heated air back into the area of the enclosure that the remaining air movers are supposed to be cooling. These situations may reduce the cooling efficiency of the remaining air mover(s), as shown by the example in FIG. 2.

Figure 2:
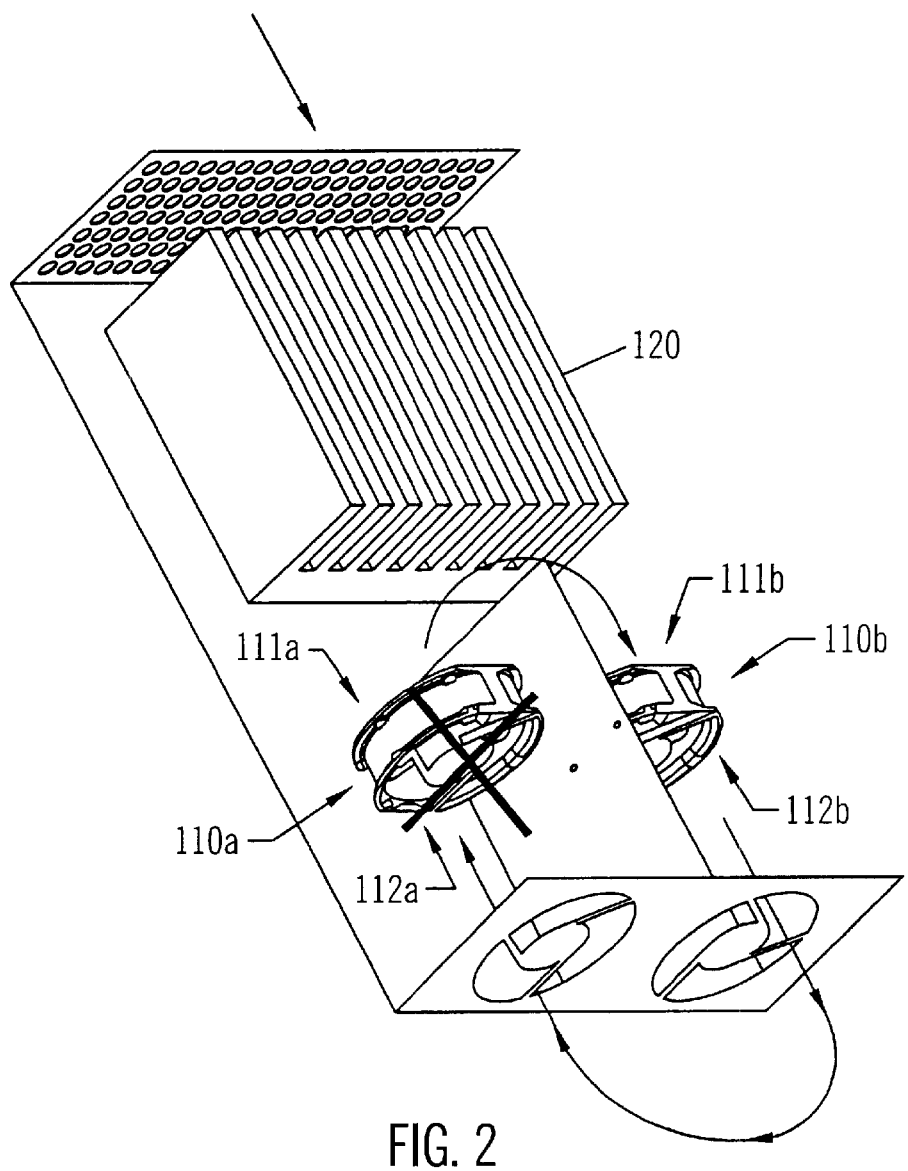
FIG. 2 shows how cooling efficiency may be reduced if one of the two air movers fails.

FIG. 2 shows the enclosure and air movers 110 from FIG. 1a. In this illustration, one of the air movers 110a has failed. While an air mover is functioning, it moves air from its intake to its exhaust. When an air mover fails, however, air may be drawn backward through (and/or around) the failed air mover. In this example, the airflow arrows show that the functioning air mover 110b is drawing air backwards through the failed air mover 110a and back into the enclosure. In some situations, this air may already be heated. For example, the air may have already been drawn into the enclosure, passed over the thermal load 120 to remove heat from the thermal load 120, and expelled out the enclosure by one of the air movers 110. The already-heated, expelled air may be drawn back into the enclosure as shown in FIG. 2. Since this air is already heated, the thermal load 120 may not be able to transfer sufficient heat to it. Additionally, because the functional air mover 110b is drawing some volume of air backwards through the failed air mover 110a, the functional air mover 10b may not be moving as great a volume of air across the thermal load 120 as it otherwise would. Thus, because the functioning air mover may be drawing air backwards through the failed air mover 110a, and also because the functioning air mover may be drawing less air across the thermal load than it was capable of drawing when both air movers where functioning, the functioning air mover's cooling efficiency may be reduced by the failure of the air mover 110a.

Generally, the failure of an air mover may describe several situations. For example, failure of an air mover may refer to a state where the air mover has completely stopped moving air. However, failure of an air mover may also refer to less drastic situations. For example, an air mover may be declared failed even though it is still marginally functional if the air mover's performance drops below a certain threshold. Thus, if the air mover, while still functioning, is not performing adequately, it may be described as failed.

In one embodiment, cooling efficiency may be better maintained during air mover failure by reducing the amount of air that can be drawn backwards through a failed air mover. Thus, by adding a device capable of reducing the backward airflow through a failed air mover, cooling efficiency may be better maintained. This backward-airflow reducing device may be added to either a system containing multiple air movers or to an air mover itself. For purposes of this disclosure, a backward-airflow reducing device is any device capable of both permitting a relatively unimpeded forward airflow through a functioning air mover and reducing or preventing backward airflow through a failed air mover by opening, closing, or obstructing a port or passageway for airflow to or from the air mover. In some embodiments, such a backward-airflow reducing device may be coupled to an air mover. In other embodiments, the backward-airflow reducing device may instead be placed elsewhere within the enclosure where it can effectively reduce backward airflow through an air mover.

In some embodiments, a backward-airflow reducing device may be a valve configured to close when the air mover fails in order to reduce the amount of air that can be drawn backwards through the air mover. At the same time, the valve may allow a relatively unchanged amount of air to be circulated through the air mover when the air mover has not failed. For example, a valve may be a relatively simple device such as a flap that is pushed open by air moving into or out of a functioning air mover and is pulled closed by gravity and/or backward airflow if the air mover fails. A valve may open or close by swinging, lifting, falling, sliding, turning, etc. In some embodiments, a valve may be a more elaborate device such as an electrically controlled device. In one embodiment, a valve may be controlled by an electronic circuit configured to detect if an air mover has failed. For example, the electronic circuit may be configured to electronically monitor several air movers in a system, and when one of the air movers fails, the electronic circuit may generate a signal that causes a valve to close and thus reduce the backward airflow through the failed air mover. In some embodiments where an electronic circuit is used, the opening or closing of the valve may be controlled by software.

Figure 3:
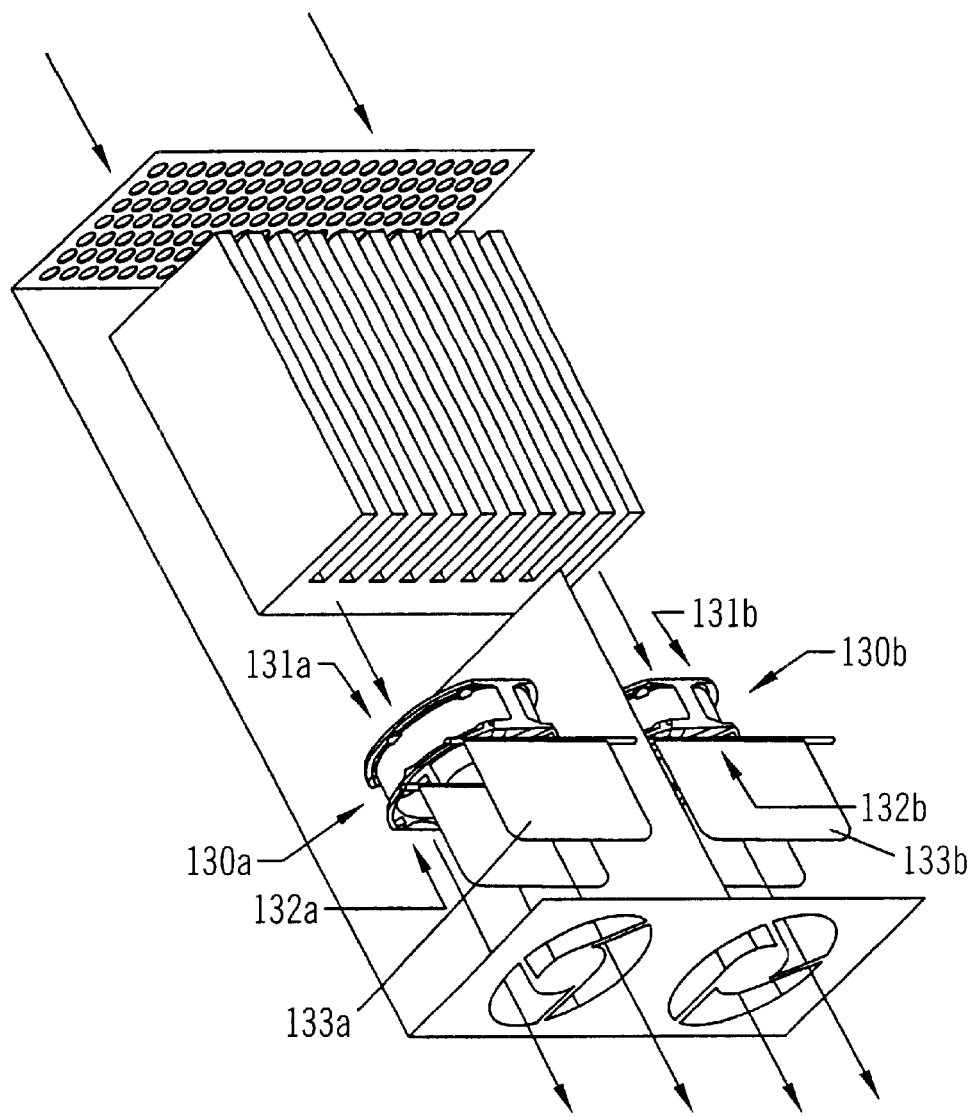
FIG. 3 shows one embodiment of an enclosure containing air movers and valves placed on the exhaust side of the air movers to reduce the amount of air that can be drawn backwards through a failed air mover.

In one embodiment, a backward-airflow reducing device such as a valve may be placed on the exhaust side of an air mover. As noted previously, the backward-airflow reducing device does not have to be directly mounted on the air mover. Instead, the backward-airflow reducing device may be located anywhere within the enclosure where it can effectively restrict the backward flow of air. FIG. 3 shows an example of an enclosure containing air movers 130 that have valves 133 installed on the exhaust side 132. When both air movers 130 are functioning, the valves 133 open to allow air to be expelled through the air movers' exhausts 132. When open, a unidirectional valve 133 may not have a large effect on the amount of air that can be moved by an air mover 130. In most embodiments, the effect of an open valve 133 on forward airflow may be negligible. However, in some embodiments, adding a valve 133 may have a non-negligible effect on the volume of air that a functioning air mover 130 is capable of moving. In such embodiments, this effect may be compensated for by using larger or additional air movers.

Figure 4:
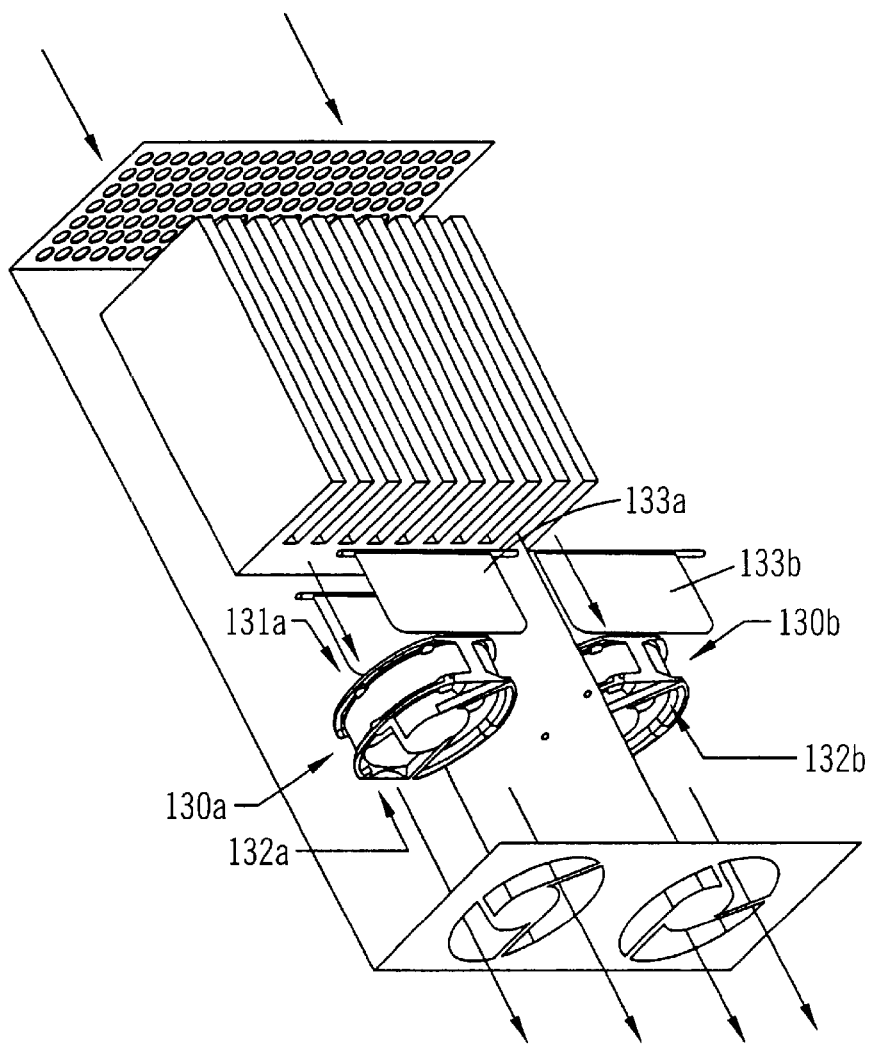
FIG. 4 shows another embodiment of an enclosure containing air movers and valves installed on the intake side of the air movers to reduce the amount of air that can be drawn backwards through a failed air mover.

In another embodiment, a backward-airflow reducing device may be installed on the intake side of an air mover. FIG. 4 shows an enclosure containing air movers that have valves installed on the intake side of the air mover. When both air movers are functioning, the valves remain open to allow the air to be drawn into the air movers' intakes. In most embodiments, the effect of an open valve on forward airflow may be negligible. However, in some embodiments, adding a valve may have a non-negligible effect on the volume of air that a functioning air mover is capable of moving. In such embodiments, this effect may be compensated for by using larger or additional air movers.

A valve may be closed in several different ways. In some embodiments, a drop or reversal in air pressure may close a valve when an associated air mover fails. For example, when an air mover fails, the air pressure around the air mover may drop or reverse due to the operating of the remaining functioning air movers in the enclosure. This pressure differential may cause the valve to close, thus reducing or eliminating the amount of air that is drawn backwards through the failed unit. In another embodiment, the valve may instead (or additionally) be closed by gravity. In other embodiments, a spring or other mechanical device may close the valve. In still other embodiments, the valve may be closed electronically. Generally, any method of closing the valve when the air mover fails may be used. In some embodiments, closing the valve may reduce the amount of air that can be drawn backwards through the failed air mover to a negligible amount.

Figure 5:
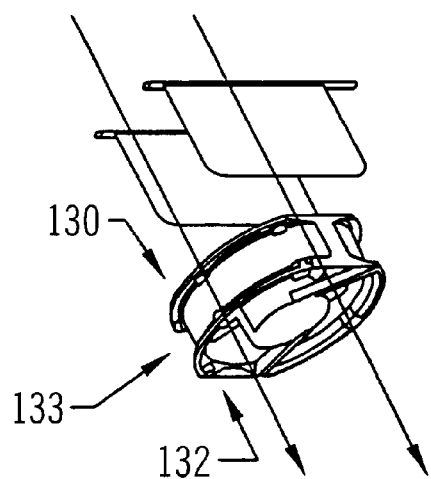
FIG. 5 shows one embodiment of an air mover with a valve installed on the intake side.
Figure 6:
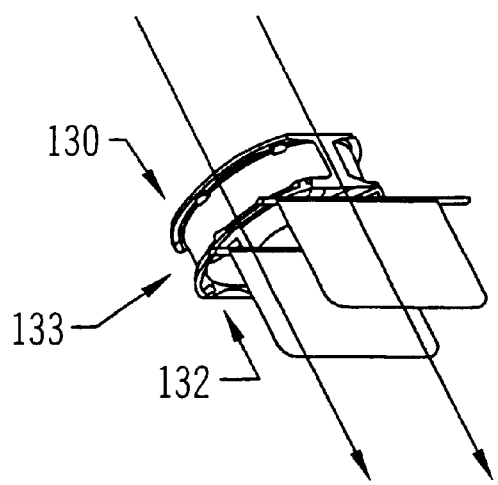
FIG. 6 shows another embodiment of an air mover with a valve installed on the exhaust side.

Many different techniques may also be used to open a valve. In certain embodiments, the forward airflow through an operating air mover may open the valve. For example, if in one embodiment the valve is added to the intake side of an air mover, the valve may open due to the air being drawn into the intake, as shown in FIG. 5. In this embodiment, the valve may continue to remain open as long as the air mover continues to draw air in. If, in another embodiment, the valve is placed on the exhaust side of an air mover, the air being pushed out of the exhaust may open the valve, as shown in FIG. 6. Generally, any method of opening the valve while the air mover is functioning may be used. For example, in one embodiment, the valve may be opened electronically. In another embodiment, a spring may open the valve. Also, the valve may be designed to remain open as long as the air mover is functioning.

Figure 7:
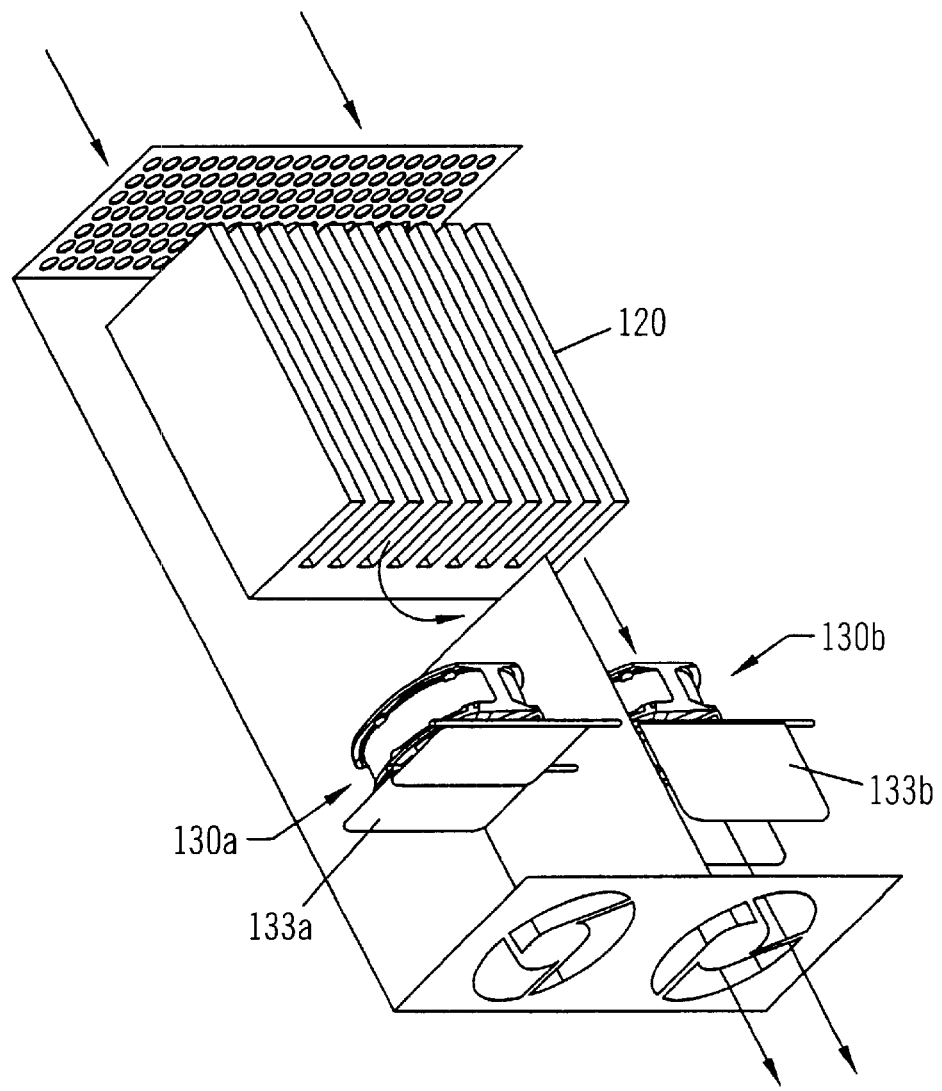
FIG. 7 shows an embodiment of an enclosure having a failed air mover and a valve configured to reduce the backward airflow through the failed air mover.

FIG. 7 shows an enclosure that has two air movers 130 with valves 133 installed on the exhaust side. As the airflow arrows indicate, one of the air movers 130a has failed. In response to the failure, the failed air mover's valve 133a has closed, thus reducing the amount of air that can be drawn backward through that air mover 130a. As a result, the remaining air mover 130b cannot draw as much air backward through the failed unit 130a as it otherwise could. Thus, the remaining air mover 130b may not be drawing as much heated air back into the enclosure and cooling efficiency may be better maintained. In some embodiments, closure of the valve may cause most of the volume of air moved by the air mover 130b to be drawn across the thermal load 120 instead of being drawn backwards through the failed air mover 130a, and thus may better maintain cooling efficiency.

Figure 8:
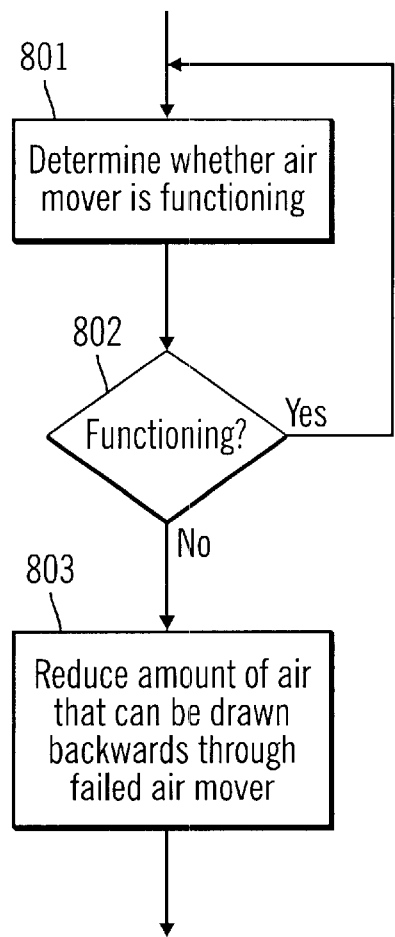
FIG. 8 illustrates a method of better maintaining cooling efficiency if an air mover fails, according to one embodiment.

FIG. 8 is a flowchart illustrating one method for maintaining cooling efficiency during air mover failure. In step 801, it is detected whether the air mover has failed or not. In some embodiments, this detection may be passive (e.g., an automatic response to an air pressure drop or reversal), while in other embodiments this detection may be active (e.g., an electronic circuit senses air mover failure). The detection may be based on air pressure. For example, if an air mover has failed, the air pressure around the air mover may drop or reverse. If the air mover has failed, the amount of air that can be drawn backward through the air mover is reduced as indicated at 803. In some embodiments, the backward airflow may be reduced by using a backward-airflow reducing device. For example, if the air pressure in the enclosure has dropped due to an air mover's failure, this drop in pressure may passively cause a valve associated with the failed air mover to close and reduce the backward airflow through the failed air mover.

Figure 9:
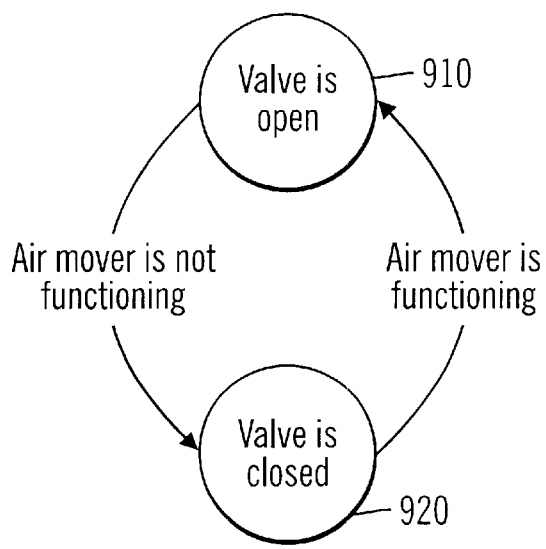
FIG. 9 illustrates another method of better maintaining cooling efficiency if an air mover fails, according to another embodiment.
Figure 10:
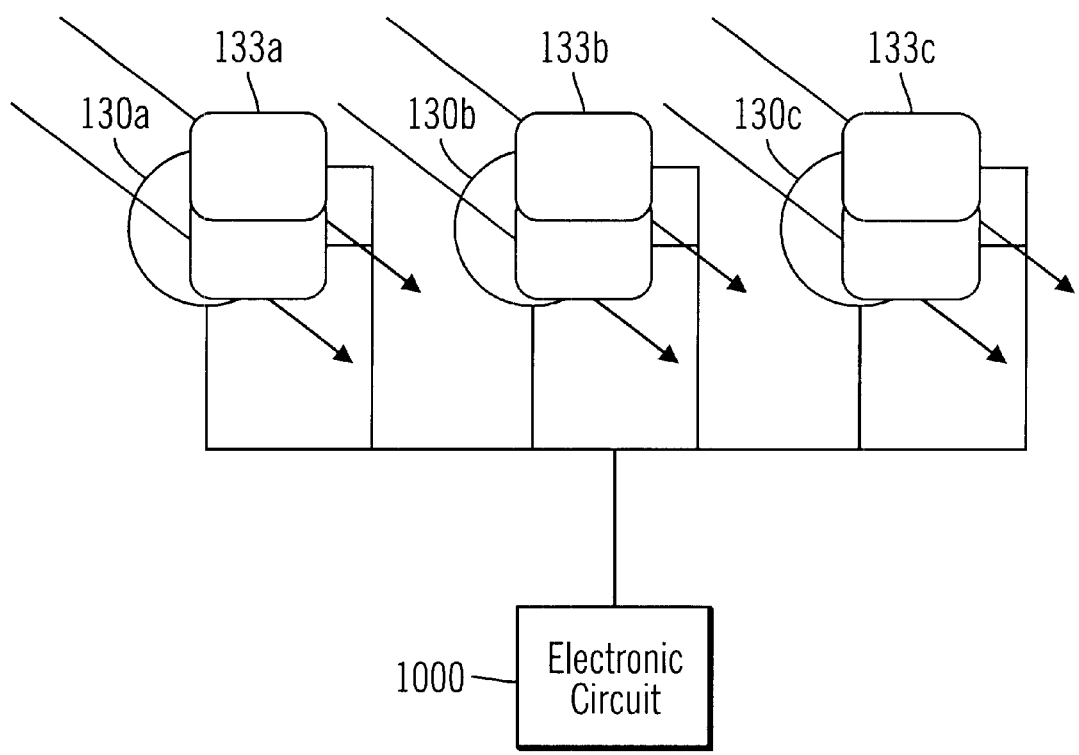
FIG. 10 illustrates an electronic circuit for detecting whether an air mover has failed according to embodiments of the invention.
Figure 11:
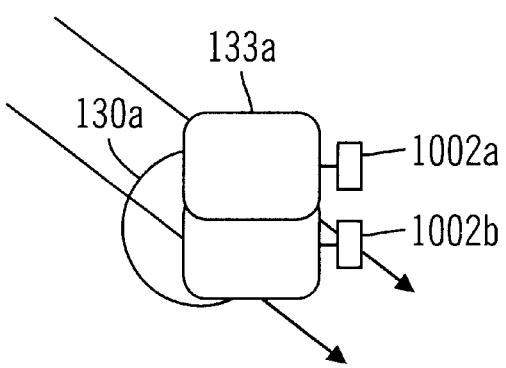
FIG. 11 illustrates an embodiment where a spring is used to close the valve.

FIG. 9 shows another method for maintaining cooling efficiency during air mover failure. Here, a valve configured to reduce the backward airflow through an air mover has an open state 910 and a closed state 920. The valve is in open state 910 whenever the air mover is functioning. If the air mover stops functioning, the valve enters closed state 920. Thus, the valve opens and closes depending on whether the air mover is functioning or not.

Numerous variations and modifications will become apparent to those skilled in the art once the above disclosure is fully appreciated. For example, while several of the above examples show enclosures containing only two air movers, it is contemplated that more air movers may be included in some embodiments. Additionally, while specific embodiments of valves were illustrated, it is contemplated that any type of backward-airflow reducing device may be used. It is intended that the following claims be interpreted to embrace all such variations and modifications.

What is claimed is:

1. An electrical enclosure, comprising:
    a thermal load configured to generate heat, wherein the thermal load comprises an integrated component;
    a plurality of air movers, wherein each air mover is configured to move air in an air channel across the thermal load by drawing the air into an intake and expelling the air from an exhaust when functioning, and wherein a portion of the plurality of air movers are configured to remove heat from the thermal load by moving air across the thermal loads; and
    a backward-airflow reducing device configured to reduce an amount of heated air moved through a first air mover that can be drawn backwards through a first air channel to a second air mover if the first air mover fails.

2. The electrical enclosure of claim 1, wherein the backward-airflow reducing device is coupled to an exhaust side of the first air mover.

3. The electrical enclosure of claim 1, wherein the backward-airflow reducing device is coupled to an intake side of the first air mover.

4. The electrical enclosure of claim 1, wherein the backward-airflow reducing device is coupled to the enclosure.

5. The electrical enclosure of claim 1, wherein the backward-airflow reducing device is further configured to allow air to be drawn into the intake of the first air mover and expelled from the exhaust of the first air mover while the first air mover is functioning.

6. The electrical enclosure of claim 1, wherein a first portion of the air movers are configured to remove heat from the thermal load by drawing cooler air across the thermal load.

7. The electrical enclosure of claim 1, wherein a first portion of the air movers are configured to remove heat from the thermal load by blowing cooler air across the thermal load.

8. The electrical enclosure of claim 1, wherein the thermal load comprises a disk drive.

9. The electrical enclosure of claim 1, wherein the thermal load comprises an arrangement of disk drives.

10. The electrical enclosure of claim 1, wherein the backward-airflow reducing device comprises a valve.

11. The electrical enclosure of claim 10, wherein the valve is further configured to open in response to the air being expelled from the exhaust when the first air mover is functioning.

12. The electrical enclosure of claim 10, wherein the valve is further configured to open in response to the air being drawn into the intake when the first air mover is functioning.

13. The electrical enclosure of claim 10, wherein the valve is further configured to open if the first air mover is functioning.

14. The electrical enclosure of claim 10, wherein the valve is further configured to close if the first air mover is not functioning.

15. The electrical enclosure of claim 10, wherein the electrical enclosure further comprises an electronic circuit configured to sense a failure of the first air mover and to generate a signal that causes the valve to close if the first air mover fails.

16. The electrical enclosure of claim 10, wherein the valve is further configured to close in response to a drop or a reversal in air pressure that occurs when the first air mover fails.

17. The electrical enclosure of claim 10, wherein the valve further comprises a spring configured to open the valve if the first air mover is functioning.

18. The electrical enclosure of claim 10, wherein the valve further comprises a spring configured to close the valve if the first air mover fails.

19. The electrical enclosure of claim 10, wherein the valve is configured to close due to gravity.

20. The electrical enclosure of claim 1, wherein the first air mover is considered to have failed if the first air mover's performance drops below a threshold level.

21. A method for maintaining cooling efficiency in an electrical enclosure during air mover failure, comprising:
   heating a portion of the enclosure;
   operating a plurality of air movers within the enclosure in order to cool the heated portion of the enclosure by moving air across the heated portion of the enclosure;
   detecting whether a first one of the air movers has failed, wherein the first air mover is configured to move air forward through a first air channel when functioning; and
   reducing an amount of air that can be drawn backwards through the first air channel by controlling a backward-airflow reducing device in response to detecting that the first air mover has failed.

22. The method as recited in claim 21, wherein said heating results from the operation of one or more disk drives within the enclosure.

23. The method as recited in claim 21, wherein said operating comprises a first portion of the air movers blowing air across the heated portion.

24. The method as recited in claim 21, wherein said operating comprises a first portion of the air movers drawing air across the heated portion.

25. The method as recited in claim 21, wherein said detecting comprises passively sensing whether the first air mover is functioning.

26. The method as recited in claim 25, wherein said passively sensing comprises responding to a drop or reversal in air pressure.

27. The method as recited in claim 21, wherein said reducing comprises closing a valve.

28. The method as recited in claim 27, wherein said closing comprises closing a valve by gravity.

29. The method as recited in claim 21, wherein said detecting comprises actively sensing a failure of the first air mover.

30. The method as recited in claim 21, wherein the first air mover is considered to have failed if the first air mover's performance has fallen beneath a threshold level.

31. An air mover configured to be used in an electrical enclosure including a thermal load generating heat and an additional air mover, comprising:
   an intake configured to draw air over the thermal load to remove heat therefrom into the air mover, wherein the thermal load comprises an integrated component, and wherein both the air mover and additional air mover remove heat from the thermal load by moving air in air channels across the thermal load;
   an exhaust configured to expel the heated air out of the air mover; and
   a backward-airflow reducing device configured to reduce an amount of heated air moved through the additional air mover that can be drawn backwards to the additional air mover through the air mover if the air mover fails.

32. The air mover of claim 31, wherein the backward-airflow reducing device is located on an exhaust side of the air mover.

33. The air mover of claim 31, wherein the backward-airflow reducing device is located on an intake side of the air mover.

34. The air mover of claim 31, wherein the backward-airflow reducing device comprises a valve.

35. The air mover of claim 31, wherein the valve is further configured to open in response to the air being drawn into the intake when the air mover is functioning.

36. The air mover of claim 31, wherein the valve is further configured to open in response to the air being expelled from the exhaust when the air mover is functioning.

37. The air mover of claim 31, wherein the valve is further configured to open if the air mover is functioning.

38. The air mover of claim 31, wherein the valve is further configured to close in response to a drop or reversal in air pressure that occurs when the air mover fails.

39. The air mover of claim 31, wherein the valve further comprises a spring configured to close the valve if the air mover fails.

40. The air mover of claim 31, wherein the valve further comprises a spring configured to open the valve while the air mover is functioning.

41. The air mover of claim 31, wherein the air mover further comprises an electronic circuit configured to generate a signal that closes the valve if the air mover fails.

42. The air mover of claim 31, wherein the air mover is considered to have failed if the air mover's performance falls below a threshold level.

43. The enclosure of claim 1, wherein the backward-airflow reducing device reduces the amount of air that can be drawn backwards by the second air mover through the first air channel if the first air mover fails.

44. The method of claim 21, wherein reducing the amount of air reduces the amount of heated air moved through the second air mover that can be drawn backwards to the second air mover through the first air channel if the first air mover fails.

45. The air mover of claim 31, wherein the backward-airflow reducing device reduces the amount of air that can be drawn backwards by the additional air mover through the air mover if the first air mover fails.

46. An enclosure, comprising:
   a thermal load configured to generate heat, wherein the thermal load comprises an integrated component;
   a first air mover positioned to move heat away from the thermal load by moving air across the thermal load through a first air channel;
   a second air mover positioned to move heat away from the thermal load by moving air across the thermal load through a second air channel;
   a valve, wherein the valve is capable of being configured in:
      (i) an open state while the first air mover is operating, wherein the first air mover moves heated air away from the thermal load through the valve positioned in the open state; and
      (ii) a closed state when the first air mover is not operating, wherein in the closed state the valve obstructs a flow of heated air moved by the second air mover away from the thermal load from flowing back to the second air mover.

47. The method of claim 21, wherein the valve is in the closed state if the first air mover is shut down or if the first air mover is partially functioning.

48. The method of claim 47, the valve comprises a first valve, further comprising:
   a second valve, wherein the second valve is capable of being configured in:
      (i) an open state while the second air mover is operating, wherein the second air mover moves heated air away from the thermal load through the second valve positioned in the open state; and
      (ii) a closed state when the second air mover is not operating, wherein in the closed state the second valve obstructs a flow of heated air moved by the first air mover away from the thermal load from flowing back to the first air mover.

* * * * *